(12) United States Patent
Harada (10) Patent No.: US 11,856,712 B2  
(45) Date of Patent: Dec. 26, 2023

(54) METHOD OF MANUFACTURING MULTILAYER SUBSTRATE

(71) Applicant: MURATA MANUFACTURING CO., LTD., Kyoto (JP)

(72) Inventor: Toshikazu Harada, Kariya (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/480,185

(22) Filed: Sep. 21, 2021

(65) Prior Publication Data

US 2022/0007519 A1 Jan. 6, 2022

Related U.S. Application Data (63) Continuation of application No. 16/307,973, filed as application No. PCT/JP2017/019527 on May 25, 2017, now Pat. No. 11,160,174.

(30) Foreign Application Priority Data

Jun. 9, 2016 (JP) .................................. 2016-115435

(51) Int. Cl.
*H05K 3/46* (2006.01)
*H05K 3/00* (2006.01)
(Continued)

(52) U.S. Cl.
CPC .............. *H05K 3/46* (2013.01); *H01L 23/12* (2013.01); *H05K 3/0026* (2013.01); *H05K 3/40* (2013.01);
(Continued)

(58) Field of Classification Search
CPC .............. H01L 23/12; H05K 2203/061; H05K 2203/107; H05K 2203/1131;
(Continued)

(56) References Cited

U.S. PATENT DOCUMENTS

| | | | |
|---|---|---|---|
| 1,116,074 A * | 11/1914 | Jones | ...................... E04H 15/04 |
| | | | 5/413 R |
| 6,440,542 B1 | 8/2002 | Kariya | |

(Continued)

FOREIGN PATENT DOCUMENTS

| CN | 1346309 A | 4/2002 |
|---|---|---|
| CN | 102342186 A | 2/2012 |

(Continued)

*Primary Examiner* — Minh N Trinh
(74) *Attorney, Agent, or Firm* — Harness, Dickey & Pierce, P.L.C.

(57) ABSTRACT

In a preparatory process of a method of manufacturing a multilayer substrate, an insulating substrate is prepared, with a conductor pattern formed only on one surface of the insulating substrate. At that time, the conductor pattern is constituted of the Cu element, a Ni layer is formed on the surface of the conductor pattern that is on the side of the insulating substrate. In a first forming process, a via hole having the conductor pattern as the bottom thereof is formed in the insulating substrate. At that time, the Ni layer that is in the area of the bottom is removed. In a filling process, a conductive paste is filled in the interior of the via hole. In a second forming process, a stacked body is formed by stacking a plurality of the insulating substrates. In a third forming process, the stacked body is heated while being subjected to pressure.

8 Claims, 4 Drawing Sheets

(51) Int. Cl.
*H05K 3/40* (2006.01)
*H01L 23/12* (2006.01)
*H05K 3/06* (2006.01)

(52) U.S. Cl.
CPC ............ *H05K 3/4053* (2013.01); *H05K 3/06* (2013.01); *H05K 2203/061* (2013.01); *H05K 2203/107* (2013.01); *H05K 2203/1131* (2013.01)

(58) Field of Classification Search
CPC .......... H05K 3/0026; H05K 3/06; H05K 3/40; H05K 3/4053; H05K 3/46
See application file for complete search history.

(56) References Cited

U.S. PATENT DOCUMENTS

| | | | |
|---|---|---|---|
| 10,517,178 | B2 | 12/2019 | Mamezaki et al. |
| 2002/0076903 | A1 | 6/2002 | Kondo et al. |
| 2002/0086145 | A1 | 7/2002 | Yazaki et al. |
| 2002/0182433 | A1 | 12/2002 | Endo |
| 2003/0007330 | A1 | 1/2003 | Kondo |
| 2003/0209796 | A1 | 11/2003 | Kondo et al. |
| 2004/0052932 | A1 | 3/2004 | Yazaki et al. |
| 2004/0208933 | A1 | 10/2004 | Kondo |
| 2004/0246688 | A1 | 12/2004 | Pai et al. |
| 2009/0071707 | A1 | 3/2009 | Endo et al. |
| 2012/0003499 | A1 | 1/2012 | Chisaka |
| 2015/0008020 | A1 | 1/2015 | Kaneko et al. |
| 2018/0141321 | A1* | 5/2018 | Ikeno .................... B32B 37/10 |
| 2022/0007519 | A1* | 1/2022 | Harada .................... H05K 3/46 |

FOREIGN PATENT DOCUMENTS

| | | |
|---|---|---|
| JP | S60086894 A | 5/1985 |
| JP | 2001226795 A | 8/2001 |
| JP | 2003008222 A | 1/2003 |
| JP | 2003023250 A | 1/2003 |
| JP | 2003060348 A | 2/2003 |
| JP | 2003086948 A | 3/2003 |
| JP | 2003110243 A | 4/2003 |
| JP | 2007250581 A | 9/2007 |
| JP | 2010080702 A | 4/2010 |
| JP | 2015015285 A | 1/2015 |

* cited by examiner

METHOD OF MANUFACTURING MULTILAYER SUBSTRATE

CROSS REFERENCE TO RELATED APPLICATIONS

This application is a Continuation Application of U.S. patent application Ser. No. 16/307,973 filed on Dec. 7, 2018 which is a U.S. National Phase Application under 35 U.S.C. 371 of International Application No. PCT/JP2017/019527 filed on May 25, 2017. These applications are based on and claim the benefit of priority from Japanese Patent Application No. 2016-115435 filed on Jun. 9, 2016. The entire disclosures of all of the above applications are incorporated herein by reference.

FIELD

The present disclosure relates to a method of manufacturing a multilayer substrate.

BACKGROUND

PTL 1 discloses a prior art method of manufacturing a multilayer substrate. With this method of manufacture, firstly an insulating substrate is prepared, having a conductor pattern formed on one side. A via hole is then formed in the insulating substrate, with the via hole having the conductor pattern at its bottom. The interior of the via hole is then filled with a via forming material. A stacked body is then formed, by stacking a plurality of the insulating substrates. The stacked body is then heated while being subjected to pressure. As a result the plurality of insulating substrates become integrated. Furthermore with this method of manufacture, the vias and the conductor patterns becoming electrical connected.

With the method of manufacture of PTL 1, a conductor pattern is formed that is made of the Cu element. A conductive paste that contains Ag particles and Sn particles may be used as the via forming material. The via forming material is then heated. As a result, vias are formed, constituted of an alloy that contains Ag element and Sn element. With this method of manufacture, when the via forming material is heated, diffusion layers are formed between the conductor patterns and the vias by mutual diffusion of the Sn element in the via forming material and the Cu element in the conductor patterns. With the method of manufacturing of PTL 1, the conductor patterns and the vias become bonded together through the diffusion layers which are formed in that way.

Furthermore a Ni layer is formed, as a surface processing layer, on the insulating substrate side surface of a usual type of conductor foil that is used in the manufacture of a multilayer substrate. When soldering is performed on conductor parts and components that are positioned on an outer surface of a multilayer substrate, if the solder wraps around a contact area between a conductor pattern and an insulating substrate, from the conductor pattern surface side, then the Cu element from the conductor pattern will diffuse into the solder. As a result, the conductor pattern may peel away from the insulating substrate. The Ni layer functions as a diffusion barrier layer that prevents this diffusion of the Cu element.

PATENT LITERATURE

PTL 1: JP 2003-110243 A

The assignee of the present disclosure has actually manufactured a plurality of multilayer substrates using the above prior art method of manufacturing a multilayer substrate. At that time, an insulating substrate having a conductor pattern made of Cu element and having a Ni layer on the surface of the conductor pattern that is on the insulating substrate side was used as an insulating substrate having a conductor pattern formed on one side. Endurance testing was then performed on a plurality of the manufactured multilayer substrates. The assignee of the present disclosure confirmed that, with a part of the plurality of multilayer substrates, cracks were readily formed between the conductor pattern and vias.

The assignee of the present disclosure then performed an element analysis of the multilayer substrates. As a result, the following was found. The multilayer substrates for which cracks were formed by the endurance testing did not have a diffusion layer formed between the conductor pattern and the vias. Even if a diffusion layer was formed, the formation of the diffusion layer was insufficient, being only formed within a narrow range. With such a multilayer substrate, an Ni layer remained on the surface of the conductor pattern between the conductor pattern and the vias. On the other hand, in the case of the multilayer substrates for which cracks were not formed by the endurance testing, the diffusion layer was formed to a sufficient extent. Furthermore there was no Ni layer on the surface of the conductor pattern between the conductor pattern and the vias. Based on such results, the assignee of the present disclosure has found that the Ni layer inhibits the forming of the diffusion layer.

The above problem is not limited to the Ni layer. It can be considered that this problem will similarly arise when a surface metal layer is formed on the surface of a conductor pattern on the insulating substrate side, inhibiting the forming of a diffusion layer.

SUMMARY

It is an objective of the present disclosure to provide a method of manufacturing a multilayer substrate whereby the occurrence of multilayer substrates having a low strength of bonding between conductor patterns and vias can be reduced.

One aspect of the technology of the present disclosure is a method of manufacturing a multilayer substrate, the method including a preparatory process, a filling process, and first, second and third forming processes.

In the preparatory process, an insulating substrate (12) is prepared, having one surface (12a) and another surface (12b) on the opposite side, with a conductor pattern (18) formed only on the one surface of the insulating substrate.

In the first forming process, after preparing the insulating substrate, a via hole (20) is formed in the insulating substrate, with the via hole having an opening at the other surface side and having the conductor pattern at the bottom thereof.

In the filling process, after forming the via hole, a via forming material (22) that contains a plurality of metal particles is filled in the interior of the via hole.

In the second forming process, after filling the via forming material, a plurality of the insulating substrates are stacked to constitute a stacked body (24).

In the third forming process, after forming the stacked body, the stacked body is heated while being subjected to pressure, causing the plurality of insulating substrates to become integrated, while also sintering the plurality of metal particles form vias (26).

In the preparatory process, an insulating substrate is prepared having a conductor pattern constituted at least of Cu element and having, on the surface of the conductor pattern that is on the insulating substrate side, a surface metal layer (16) that at least is constituted of a metal element having a higher activation energy than that of a metal which constitutes the via forming material and than that of the Cu element.

The first forming process includes a process (removal process) for removing the surface metal layer that is positioned in an area of the conductor pattern at the bottom of the via hole, performed in a period between the time of forming the via hole until prior to the time of filling the via forming material in the via hole.

In the third forming process, in addition to forming the vias, diffusion layers (28) which contain the metal element constituting the vias and the Cu element are formed between the conductor patterns and the vias.

With the method of manufacturing of the present disclosure, before filling the interior of a via hole with the via forming material, the surface metal layer that is positioned at the bottom of the via hole is removed. In that way, diffusion layers can be sufficiently formed between the vias and the conductor patterns. Hence with the method of manufacturing of the present disclosure, the occurrence of multilayer substrates having a low strength of attachment between a conductor pattern and a via is reduced.

It should be noted that the reference numerals in parentheses for respective elements in the above indicate an example of a correspondence relationship between these elements and specific elements that are described in the following embodiments.

DESCRIPTION

Embodiments of the technology of the present disclosure are described in the following referring to the drawings. Parts which are mutually identical or equivalent between the embodiments are described in the following with the same symbols being assigned to the parts in the respective embodiments.

First Embodiment

A method of manufacturing a multilayer substrate according to a first embodiment will be described using FIG. 1 and FIG. 2.

Figure 1:
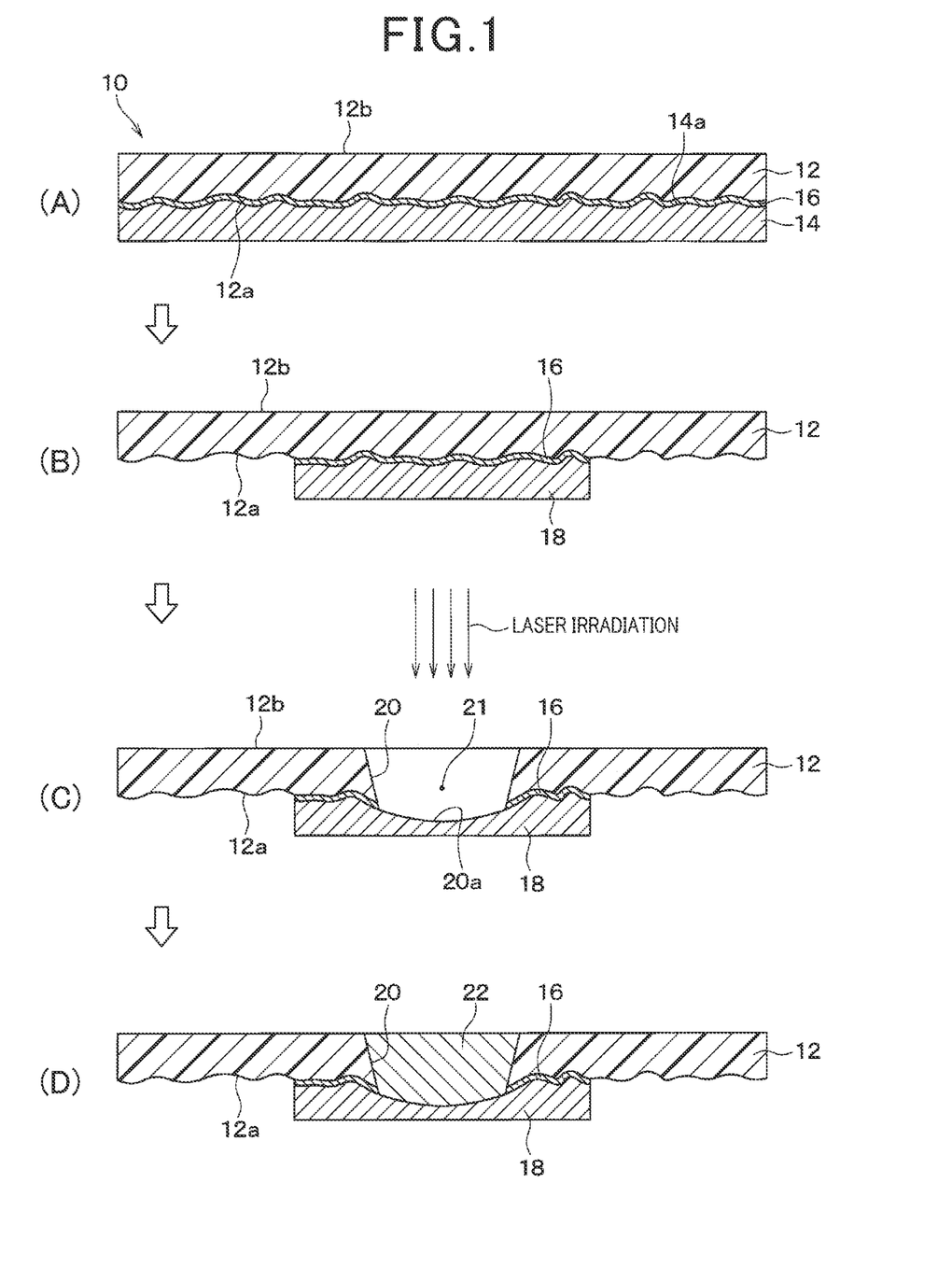
FIG. 1 is a cross-sectional view showing a method of manufacturing a multilayer substrate according to a first embodiment.

As shown in FIG. 1(A), with this embodiment, a process (preparatory process) of preparing a single sided conductor film 10 is first executed. The single sided conductor film 10 has a resin film 12 has 12 and a conductor foil 14. The resin film 12 has one surface 12a and another surface 12b on the opposite side. The conductor foil 14 contacts only the one surface 12a, of the surfaces 12a and 12b. The resin film 12 is a film-like insulating substrate with reduced thickness. The resin film 12 is constituted of thermoplastic resin. The conductor foil 14 is constituted of a pure metal, which is the Cu.

The conductor foil 14 has a surface treatment layer or a surface processing layer of a Ni layer 16 or the like, formed on a resin surface 14a, which is the surface on the resin film 12 side. It should be noted that in FIGS. 1 and 2, only the Ni layer 16 is shown as a surface treatment layer or a surface processing layer. The resin surface 14a is subjected to a roughening treatment, for increasing the adhesion between the resin film 12 and the conductor foil 14. The resin surface 14a could also be referred to as a roughened surface, a Matte surface, or a M surface, etc.

The Ni layer 16 is a metal layer constituted of the Ni. With this embodiment the Ni layer 16 corresponds to a surface metal layer that is formed on the surface of a conductor pattern at the insulating substrate side. The Ni is a metal element which has a higher activation energy than that of the Cu which constitutes the conductor foil 14 and of the Sn which constitutes a via forming material 22, described hereinafter. The activation energy is the energy required for activating a starting material from the ground state of a reaction to a transition state. The activation energy is also referred to as the Arrhenius parameter. If the activation energy is high, this signifies that there is an activation barrier. Hence the Ni layer 16 functions as a diffusion barrier layer which prevents the Cu in the conductor foil 14 from diffusing into solder (not shown in the drawings). Due to the Ni layer 16, solder that is used for connecting the conductor pattern and parts located on an outer surface of the multilayer substrate is prevented from wrapping round from the surface on the conductor foil 14 side to the resin surface 14a. The Ni layer 16 is a plating layer, formed by a plating treatment. The Ni layer 16 contains 99% Ni by mass overall, and 1% of impurities other than the Ni by mass overall.

As exemplified in FIG. 1(B), in the preparatory process of the method of manufacturing of the present embodiment, a process of forming a conductor pattern 18 is next executed. In this process, patterning of the conductor foil 14 is performed by photolithography and etching. In that way, the conductor pattern 18 is formed with a desired flat shape, for constituting electric circuits.

Next as shown in FIG. 1(C) with the method of manufacturing of the present embodiment, a process of forming a via hole 20 (first forming process) is executed. In this process, the other surface 12b of the resin film 12 is irradiated by a laser. The laser which is used at that time can for example be a carbon dioxide gas laser or the like. In this process, the irradiation time of the laser is set as follows. Specifically, the irradiation time of the laser output is set such that the via hole 20 extends from the other surface 12b of the resin film 12 to the conductor pattern 18, and is set such as to remove the Ni layer 16. In that way with this process, the via hole 20 is formed in the resin film 12 with the via hole 20 having an opening in the other surface 12b side and having the conductor pattern 18 as its bottom 20a. Furthermore in this process, a part of the Ni layer 16 (surface metal layer) on the conductor pattern 18 that is located within the area of the bottom 20a of the via hole 20 is removed. That is to say, the part of the Ni layer 16 on the conductor pattern 18 that is within an area facing the interior space 21 of the via hole 20 is removed. In that way, in the first forming process of this embodiment, between the interval from the time of forming the via hole 20 until prior to filling the conductive paste 22 (via forming material) in the interior of the via hole 20, there is a removal process for removing the Ni layer 16. It should be noted that it is desirable to remove all of the Ni layer 16 within that area, however it would be equally possible not to remove all of the Ni layer 16. So long as the forming of a diffusion layer 28 described in the following is not inhibited, it would be permissible for a Ni metal portion constituted of the Ni to remain.

As exemplified in FIG. 1(D), with this embodiment a process (filling process) is executed for filling conductive paste 22 in the interior of the via hole 20. The conductive paste 22 is a via constituent material for forming vias 26, described in the following. The conductive paste 22 consists of metal particles mixed with a solvent to form a paste. Furthermore, a binder is mixed in the conductive paste 22. The binder can for example consist of polyimide particles, glass powder, epoxy resin, polyester resin, etc.

With this embodiment, the conductive paste 22 contains a plurality of Ag particles and a plurality of Sn particles, as a plurality of metal particles. Furthermore the composition ratio of the Ag component and the Sn component in the conductive paste 22 is set. Specifically, the composition ratio of the Ag component and the Sn component is set such that an alloy which constitutes the via 26 will have a required composition, even if a diffusion layer 28 is formed. That is to say, the conductive paste 22 has an overall proportion of Sn component that is high by comparison with the case in which the via 26 is formed only with the required alloy composition. As a result, with the method of manufacturing this embodiment, even when diffusion layers 28 are formed, vias 26 can be formed having the required alloy composition. Furthermore a lowering of the strength of the vias 26 due to variation of the alloy composition of the vias 26 can be prevented.

With the method of manufacturing of the present embodiment, after the above process (filling process) there will be no Ni layer 16 between the conductive paste 22 and the conductor pattern 18. Alternatively, a Ni metal portion constituted of Ni will only be partially present between the conductive paste 22 and the conductor pattern 18. That is to say the Ni will not be present in a layer between the conductive paste 22 and the conductor pattern 18.

Figure 2:
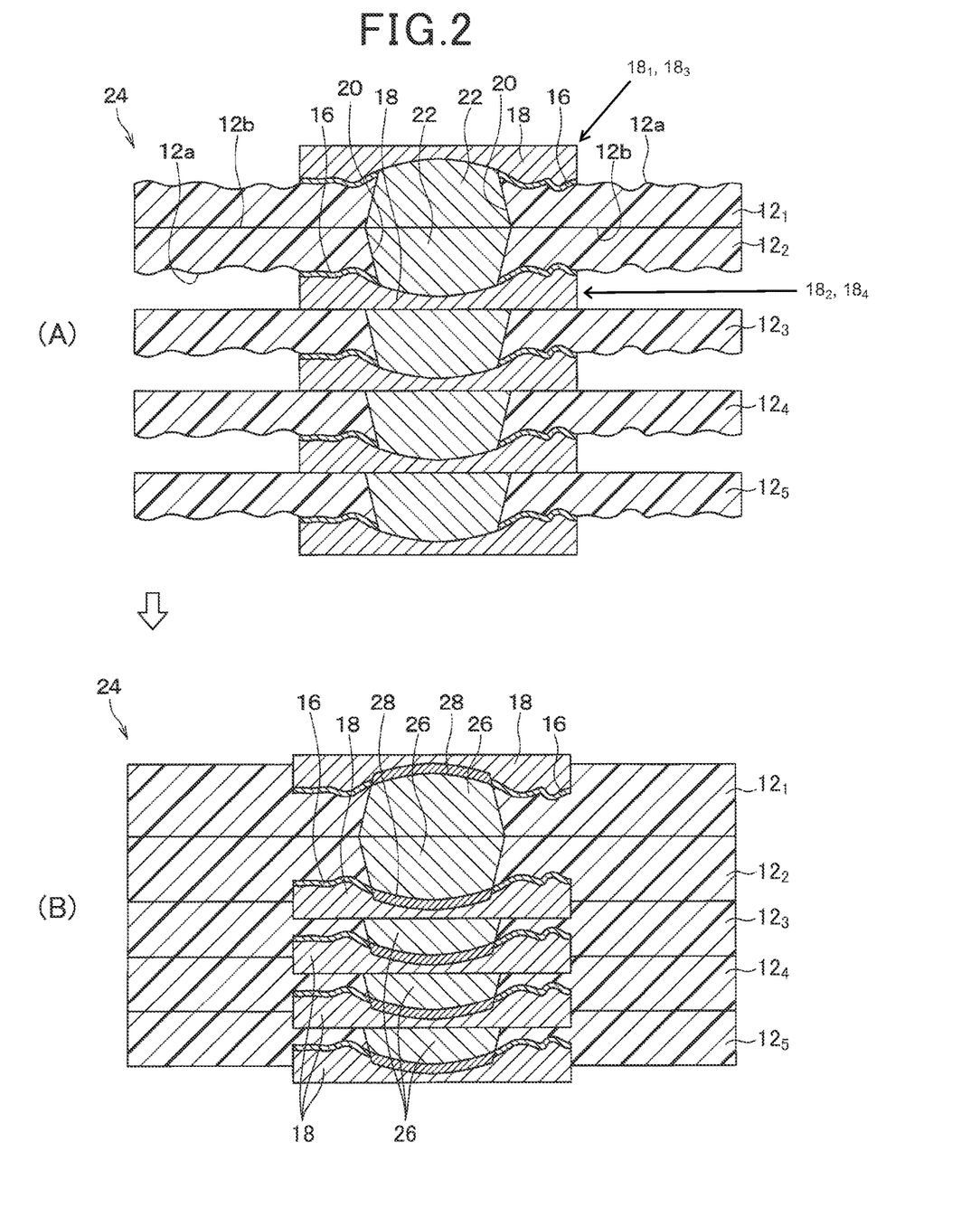
FIG. 2 is a cross-sectional view that is a continuation of FIG. 1, showing the method of manufacturing a multilayer substrate.

Next with the present embodiment, as shown in FIG. 2(A), a plurality of resin films $12_1$ to $12_5$ and a plurality of conductor patterns $18_1$ to $18_4$ are stacked in a stacking process (second forming process), to form a stacked body 24. Each of the plurality of resin films $12_1$ to $12_5$ that are stacked has the conductive paste 22 filled in the via hole 20.

With this embodiment, the via holes 20 that are respectively formed in the plurality of resin films $12_1$ to $12_5$ are arrayed as a column in the stacking direction. Furthermore, of the plurality of resin films $12_1$ to $12_5$, the resin film $12_1$ that is stacked at the uppermost position is stacked facing in the opposite direction to the other resin films $12_2$ to $12_5$. Hence, the first resin film $12_1$ and the second resin film $12_2$ are connected together by the conductive paste 22.

As shown in FIG. 2(B), a process (third forming process) is executed in which the stacked body 24 is heated while being subjected to pressure. The heating temperature in this process is for example in the range 232 to 350° C.

In that way with this process, the stacked body 24 made up of the plurality of plurality of resin films $12_1$ to $12_5$ becomes integrated. Furthermore the Ag particles and Sn particles become sintered, forming vias 26. Specifically, the Sn particles melt and form an alloy with the Ag particles. The alloy particles are then sintered to form the vias 26. Hence the vias 26 are formed of an alloy of Sn and Ag. In the resin films $12_2$ to $12_5$ of the stacked body 24, the resin films 12 and the conductor patterns 18 become integrated. The conductor patterns 18 and the vias 26 become integrated. Furthermore the vias 26 that are formed in the first resin film $12_1$ and the second resin film $12_2$ of the stacked body 24 become integrated with one another.

Furthermore in this process (the third forming process), a diffusion layer 28 is formed in each resin film 12. Specifically, a diffusion layer 28 that contains the Cu and the Sn is formed between the via 26 that is formed in a via hole 20 and the conductor pattern 18 at the bottom 20a of that via hole 20. The diffusion layer 28 is produced by mutual diffusion between the Cu that constitutes the conductor pattern 18 and the Sn that constitutes the metal particles in the conductive paste 22. It should be noted that the Ni layer 16 is not formed between the via 26 and the glossy surface that is on the opposite side from the resin surface 14a of the conductor foil 14. Hence although not shown in the drawings, the diffusion layer 28 is also formed between the glossy surface of the conductor pattern 18 and the via 26. Furthermore, so long as the alloy constituting the via 26 is formed, and the diffusion layer 28 is formed, the temperature in this process could be made lower than the above temperatures (for example 232° C.).

In that way with this embodiment, the following form of multilayer substrate is manufactured. Specifically, a multilayer substrate is manufactured in which a plurality of resin films $12_1$ to $12_5$, each having a conductor pattern 18 formed on a surface, are stacked together, with a structure in which conductor patterns 18 that are arrayed along the stacking direction are connected together through vias 26 which are formed in the resin films 12.

Figure 3A:
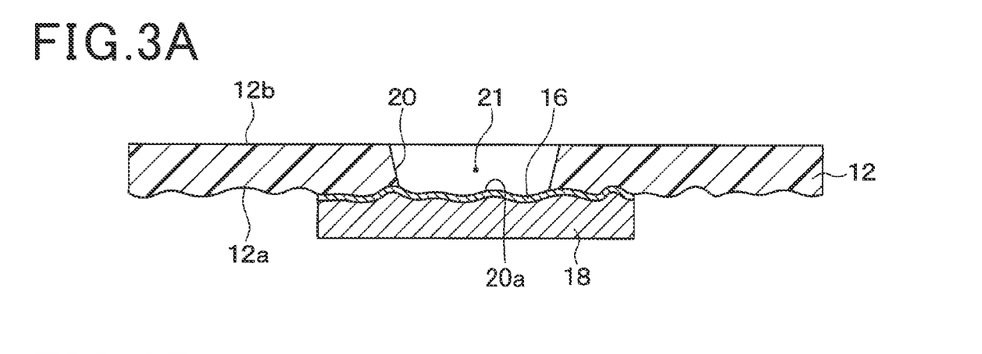
FIG. 3A is a cross-sectional view showing a method of manufacturing a multilayer substrate according to a comparison example 1.

The method of manufacturing a multilayer substrate of the present embodiment will here be compared with a comparison example 1 of a method of manufacturing a multilayer substrate. As shown in FIG. 3A the comparison example 1 differs in that a Ni layer 16 is not removed in the process (corresponding to the first forming process of the present embodiment) for forming a via hole 20. That is to say, the comparison example 1 does not include the removal process that is in the first forming process of the present embodiment. It should be noted that the other processes of the method of manufacturing a multilayer substrate of the comparison example 1 are the same as the processes in the method of manufacturing of the present embodiment.

Figure 3B:
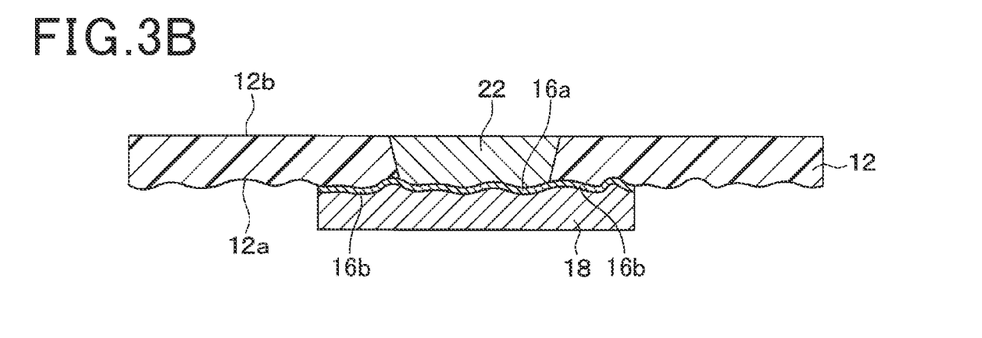
FIG. 3B is a cross-sectional view showing the method of manufacturing a multilayer substrate according to the comparison example 1.
Figure 3C:
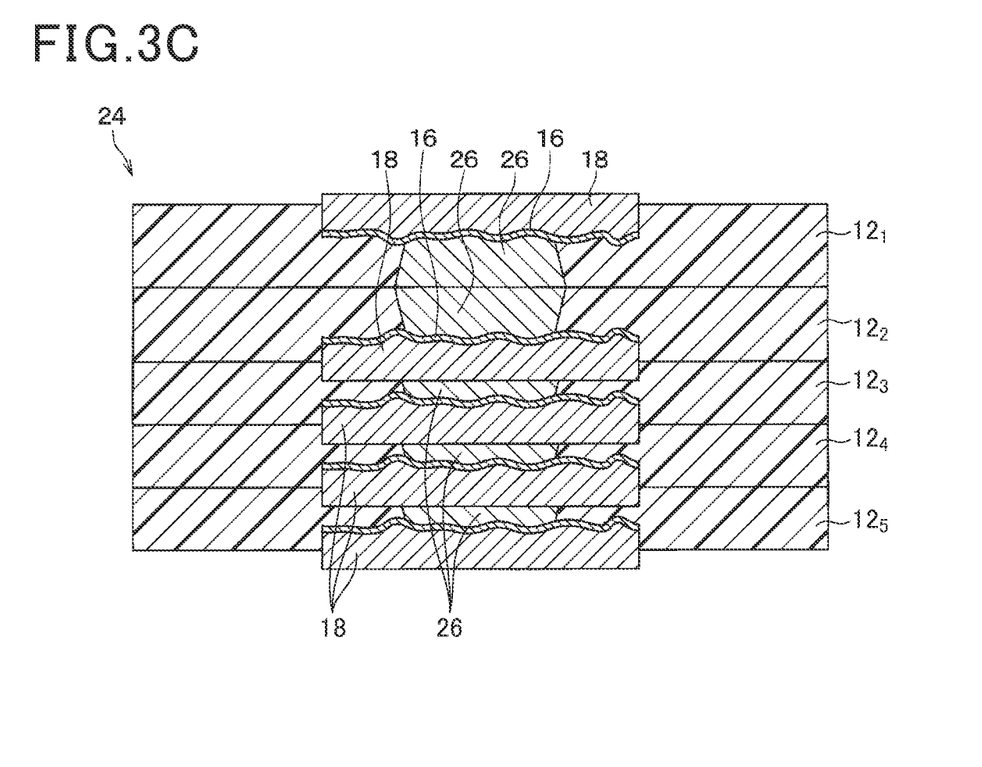
FIG. 3C is a cross-sectional view showing the method of manufacturing a multilayer substrate according to the comparison example 1.

Hence with the comparison example 1 as shown in FIG. 3B, when the conductive paste 22 is filled in, the Ni layer 16 is present between the conductive paste 22 and the conductor pattern 18. Specifically, a Ni layer 16a, having the same thickness as the Ni layer 16b that is located outside the interior space 21 of the via hole 20, is present in the range of the bottom 20a of the via hole 20. Furthermore as shown in FIG. 3C, with the comparison example 1, there are cases in which no diffusion layer 28 is formed after the process (corresponding to the third forming process of the present embodiment) for heating the stacked body 24 while applying pressure. The cause of this is that diffusion between the Cu (the metal element that constitutes the conductor pattern 18) and the Sn (the metal element that constitutes the metal particles in the conductive paste 22) is blocked by the Ni layer 16 that is positioned between the conductive paste 22 and the conductor pattern 18.

As opposed to this, with the present embodiment, the Ni layer 16 is removed (execution of removal process) in the process (first forming process) for forming a via hole 20. Hence with the method of manufacturing of the present embodiment, the Cu and the Ni become diffused, in the process for heating the stacked body 24 while applying pressure. The diffusion layer 28 is formed as a result. Thus a multilayer substrate that is manufactured by the method of the present embodiment has a structure in which conductor patterns 18 and vias 26 are bonded by diffusion layers 28. That is to say, the conductor patterns 18 and vias 26 have a diffusion bonded structure.

With the method of manufacturing a multilayer substrate of the present embodiment as described above, by comparison with the method of manufacture of the comparison example 1, the bonding strength (connection strength) between a via 26 and a conductor pattern 18 is increased (a high strength can be achieved). That is to say when a comparison is made, using a plurality of multilayer substrates manufactured by the method of the present embodiment, with the case of a method of manufacture in which the Ni layer 16 is not removed, it is found that problems with the manufactured multilayer substrates are reduced by the method of manufacturing of the present embodiment. Specifically, there is a reduction of multilayer substrates which have a low strength of bonding between vias 26 and conductor patterns 18.

With the method of manufacturing a multilayer substrate of the present embodiment, in the process (corresponding to the first forming process of the present embodiment) for forming a via hole 20, the via hole 20 is formed by laser irradiation. Hence the bottom 20a of the via hole 20 that is formed has a concave spherical surface at the interior space 21 side. As a result of this, with the method of manufacturing of the present embodiment, the area of the diffusion layer 28 is enlarged by comparison with the case in which the bottom 20a of the via hole 20 has a flat surface. Therefore, the bonding strength (connection strength) between a via 26 and a conductor pattern 18 is increased.

Second Embodiment

With the method of manufacturing a multilayer substrate of the first embodiment, the Ni layer 16 is removed in a process (first forming process) for forming a via hole 20. That is, with the first embodiment, the first forming process includes a removal process. As opposed to this, with the present embodiment, a process for forming the via hole 20 and a process for removing the Ni layer 16 are respectively separate. That is, with this embodiment, there is a first forming process and a removal process which are respectively separate.

Figure 4:
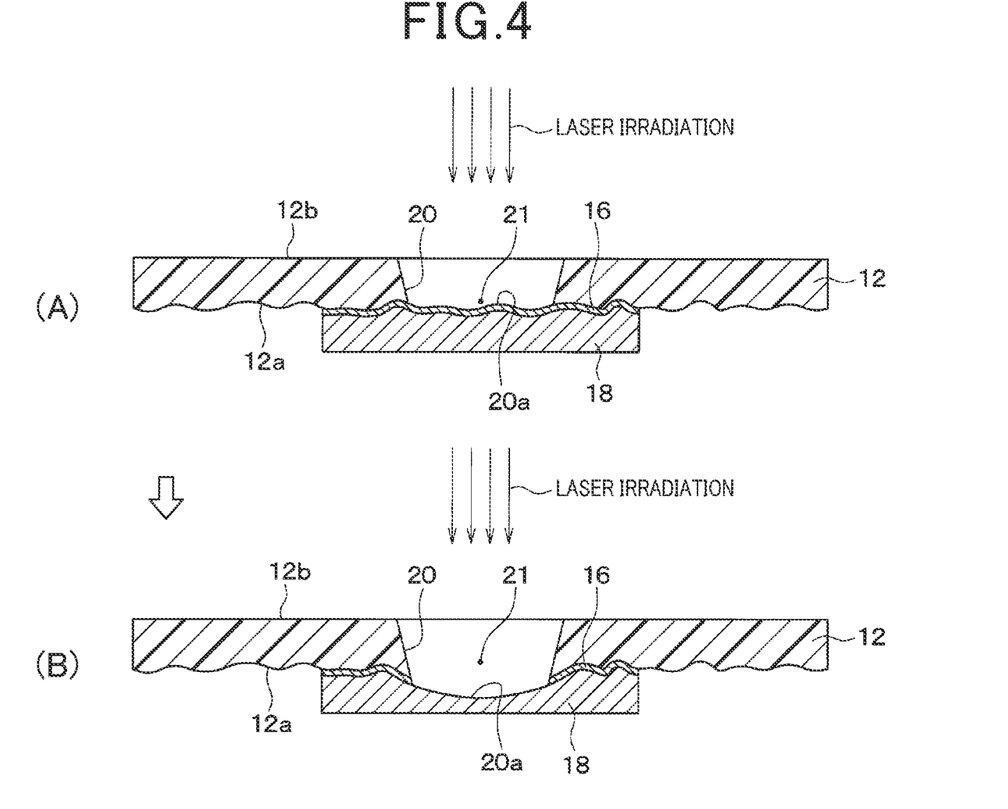
FIG. 4 is a cross-sectional view showing a method of manufacturing a multilayer substrate according to a second embodiment.

With the method of manufacturing of the present embodiment, after the process for forming a conductor pattern 18 as shown in FIG. 1(B), the following process is executed. Specifically as shown in FIG. 4(A), a via hole 20 is formed by irradiating the other surface 12b of the resin film 12 by a carbon dioxide gas laser. At that time there is a Ni layer 16 present at the bottom 20a of the via hole 20. That is to say, the conductor pattern 18 and the Ni layer 16 form the bottom 20a of the via hole 20.

Next with the method of manufacturing of the present embodiment, as shown in FIG. 4(B), the interior of the via hole 20 is irradiated by an excimer laser that is capable of fine removal processing. In that way with the present embodiment, the Ni layer 16 is removed from a part of the conductor pattern 18 that is located in the range of the bottom 20a of the via hole 20.

Thereafter with the method of manufacturing of the present embodiment, in the same way as for the first embodiment, a process (corresponding to the filling process of the first embodiment) is executed for filling with conductive paste 22.

As described above, with the method of manufacturing of the present embodiment, after performing a process (first forming process) for forming a via hole 20 and before performing a process (filling process) for filling conductive paste 22 in the via hole 20, a process (removal process) is executed for removal of the Ni layer 16. The same effects as for the first embodiment can be obtained by this.

Other Embodiments (1) With each of the above embodiments, a conductor patterns 18 is constituted of pure metal consisting of the Cu, however it is not limited to that. It is only necessary for a conductor pattern 18 to be constituted at least of the Cu.

(2) With each of the above embodiments, a plurality of Ag particles and a plurality of Sn particles are used as metal particles contained in the conductive paste 22, however it is not limited to that. It would be equally possible to use other metal particles for the conductive paste 22.

Furthermore, it would be equally possible for a plurality of Ag particles to be used as the plurality of metal particles. In that case, a via 26 would be formed of pure metal consisting of the Ag. A diffusion layer 28 would be formed of a layer that contains the Cu which constitutes the conductor patterns 18 and the Ag that constitutes the plurality of metal particles.

Furthermore it would be equally possible for example to use the Cu and the Sn as the plurality of metal particles. In that case, a via 26 would be formed of an alloy that contains the Cu and the Sn. A diffusion layer 28 would be formed of a layer that contains the Cu which constitutes the conductor patterns 18, and the Cu and Sn which constitute the plurality of metal particles.

(3) With each of the above embodiments, a Ni layer 16 contains 99% Ni by mass overall. The content ratio of the Ni in a Ni layer is not limited to that.

(4) With each of the above embodiments, a Ni layer 16 is formed as a surface metal layer, however it is not limited to that. It would be equally possible for the surface metal layer to be formed of a metal layer other than a Ni layer 16.

It would be equally possible to use any layer, so long as it is constituted at least of a metal element having an activation energy that is high by comparison with that of the Cu which constitutes a conductor pattern 18 and the metal element which constitutes the via formation material. Irrespective of whether the metal element that constitutes the via formation material is Sn or Ag, the surface metal layer can be constituted of any single metal element other than the Ni element so long as that metal element has an activation energy which is high by comparison with that of the via formation material, such as for example Co, Pt, W, Mo, etc. It would be equally possible for the surface metal layer to be constituted of a pure metal consisting of a single metal element. Moreover, it would be equally possible for the surface metal layer to be constituted of a plurality of metal elements. Hence, the surface metal layer could equally be constituted of more than one metal element, selected from among Ni, Co, Pt, W, and Mo.

(5) With each of the above embodiments, a resin film 12 is constituted of a thermoplastic resin, however it is not limited to that. It would be equally possible for the resin film 12 to be constituted of a resin other than a thermoplastic resin, such as for example a thermosetting resin, etc. Furthermore it would be equally possible for the resin film 12 to be constituted of a flexible material other than a resin.

(6) The technology of the present disclosure is not limited to the above embodiments. The technology of the present disclosure may be changed appropriately within the scope that is set out in the claims. The technology of the present disclosure encompasses various modifications and variations that are within an equivalent scope. Furthermore, the embodiments described above are not unrelated to each other, and can be appropriately combined, other than when such combination is clearly not possible. In each of the above-described embodiments, the constituent elements of the embodiments are not necessarily essential, unless they are clearly essential and can be considered to be obviously essential in principle. Furthermore with each of the above embodiments, other than when a number, a numerical value, a quantity, a range, etc., of the constituent elements of the embodiment is expressly stated, and is obviously limited to the specific number or range in principle, the embodiment is not limited to that specific number, numerical value, quantity, range, etc. Furthermore with each of the above embodiments, other than when a material, shape, positional relationship, etc., of the constituent elements of the embodiment is expressly stated, and is obviously limited to the specific number or range in principle, the embodiment is not limited to that specific material, shape, positional relationship, etc.

SUMMARY

According to a first aspect that is demonstrated by all or part of each of the above embodiments, a multilayer substrate manufacturing method which is one form of the present disclosure includes a preparatory process, a filling process, and first, second and third forming processes.

In the preparatory process, an insulating substrate is prepared, having one surface and another surface on the opposite side, with a conductor pattern formed only on the one surface of the insulating substrate.

In the first forming process, after preparing the insulating substrate, a via hole is formed in the insulating substrate, with the via hole having an opening at the other surface side and having the conductor pattern at a bottom thereof.

In the filling process, after forming the via hole, a via forming material that contains a plurality of metal particles is filled in the interior of the via hole.

In the second forming process, after filling the via forming material, a plurality of the insulating substrates are stacked to constitute a stacked body.

In the third forming process, after forming the stacked body, the stacked body is heated while being subjected to pressure, causing the plurality of insulating substrates to become integrated, while also sintering the plurality of metal particles to form vias.

In the preparatory process, an insulating substrate is prepared having a conductor pattern constituted at least of the Cu element and having, on the surface of the conductor pattern that is on the insulating substrate side, a surface metal layer which at least is constituted of a metal element having a higher activation energy than that of a metal which constitutes the via forming material and than that of the Cu element.

The first forming process includes a process (removal process) for removing the surface metal layer that is positioned in an area of the conductor pattern at the bottom of the via hole, performed in a period between the time of forming the via hole until prior to the time of filling the via forming material in the via hole.

In the third forming process, in addition to forming the vias, diffusion layers which contain the metal element constituting the vias and the Cu element are formed between the conductor patterns and the vias.

Furthermore, according to a second aspect, a plurality of Ag particles and a plurality of Sn particles are used as the plurality of metal particles of the filler material. In the third forming process layers containing the Cu element and Ag element are formed as the diffusion layers. In the first aspect, for example, that structure can be adopted.

Furthermore according to a third aspect, in the filling process, a plurality of Ag particles are used as the plurality of metal particles. In the third forming process, layers containing the Cu element and the Ag element are used as the diffusion layers. In the first aspect, for example, that structure can be adopted.

Furthermore, according to a fourth aspect, a plurality of Cu particles and a plurality of Sn particles are used as the plurality of metal particles. In the third forming process, layers containing the Cu element and the Sn element are used as the diffusion layers. In the first aspect, for example, that structure can be adopted.

Furthermore according to a fifth aspect, in the preparatory process, a layer constituted of more than one metal element, selected from among Ni, Co, Pt, W, and Mo, could be used as the surface metal layer. In the second to fourth aspects, for example, that structure can be adopted.

What is claimed is:

1. A multilayer substrate comprising:
    a stacked body including a plurality of insulating substrates each of which includes a first surface and a second surface opposite to the first surface, the plurality of insulating substrates being stacked on each other and including a first insulating substrate and a second insulating substrate that are constituted of thermoplastic resin;
    a first conductor pattern provided on the first surface of the first insulating substrate and being a conductor foil containing a Cu element, the first conductor pattern including a third surface exposed from the multilayer substrate by being located on an outermost layer and a fourth surface located closer to the first insulating substrate than to the third surface;
    a second conductor pattern provided on the second surface of the second insulating substrate and being a conductor foil containing a Cu element;
    a surface processing layer provided on the fourth surface of the first conductor pattern;
    a first via provided in the first insulating substrate; and
    a second via provided in the second insulating substrate, wherein:
    the surface processing layer is not provided in at least a portion of an area in which the first via is connected to the first conductor pattern;
    the second insulating substrate is bonded to the second surface of the first insulating substrate;
    the first via and the second via are bonded together without the conductor foil;
    the plurality of insulating substrates of the stacked body include a third insulating substrate and a fourth insulating substrate;

the multilayer substrate further includes:

a third conductor pattern provided on the second surface of the third insulating substrate and being a conductor foil containing a Cu element, the third conductor pattern including a fifth surface exposed from the multilayer substrate by being located on the outermost layer and a sixth surface located closer to the third insulating substrate than to the fifth surface;

a fourth conductor pattern provided on the second surface of the fourth insulating substrate and being a conductor foil containing a Cu element;

a surface processing layer provided on the sixth surface of the third conductor pattern; and a third via provided in the third insulating substrate;

the surface processing layer is not provided in at least a portion of an area in which the third via is connected to the third conductor pattern;

the fourth insulating substrate is bonded to the first surface of the third insulating substrate;

the fourth conductor pattern is connected to the third via;

the surface processing layer is not provided in at least a portion of an area in which the third via is connected to the fourth conductor pattern; and the third insulating substrate and the fourth insulating substrate locate the second surface with respect to the first insulating substrate and the second insulating substrate.

2. The multilayer substrate according to claim 1, wherein the surface processing layer is not provided on the third surface of the first conductor pattern.

3. The multilayer substrate according to claim 1, wherein a surface roughness of the fourth surface of the first conductor pattern is larger than a surface roughness of the third surface of the first conductor pattern.

4. The multilayer substrate according to claim 1, wherein a portion of which the first conductor pattern to which the first via is connected is concaved.

5. The multilayer substrate according to claim 1, further comprising a diffusion layer containing the Cu element and a metal element that constitutes a via formation material, between the first conductor pattern and the first via.

6. The multilayer substrate according to claim 1, wherein a material of the first via includes Ag and Sn.

7. The multilayer substrate according to claim 1, wherein a material of the first via includes Cu and Sn.

8. The multilayer substrate according to claim 1, wherein the surface processing layer is made of one or more metal element selected from Ni, Co, Pt, W, and Mo.

* * * * *